(12) United States Patent
Coronel et al.

(10) Patent No.: US 7,960,255 B2
(45) Date of Patent: Jun. 14, 2011

(54) PROCESS FOR FORMING A WIRE PORTION IN AN INTEGRATED ELECTRONIC CIRCUIT

(75) Inventors: Philippe Coronel, Barraux (FR);
Benjamin Dumont, Grenoble (FR);
Arnaud Pouydebasque, Gieres (FR);
Markus Müller, Brussels (BE)

(73) Assignees: STMicroelectronics (Crolles 2) SAS, Crolles (FR); NXP B.V., Eindhoven (NL)

( * ) Notice: Subject to any disclaimer, the term of this patent is extended or adjusted under 35 U.S.C. 154(b) by 0 days.

(21) Appl. No.: 12/679,882

(22) PCT Filed: Sep. 22, 2008

(86) PCT No.: PCT/EP2008/062622
§ 371 (c)(1),
(2), (4) Date: Mar. 24, 2010

(87) PCT Pub. No.: WO2009/040328
PCT Pub. Date: Apr. 2, 2009

(65) Prior Publication Data
US 2010/0203712 A1   Aug. 12, 2010

(30) Foreign Application Priority Data

Sep. 26, 2007 (EP) .................................. 07301401

(51) Int. Cl.
*H01L 21/36* (2006.01)
*H01L 21/20* (2006.01)

(52) U.S. Cl. .................. 438/478; 257/E21.09; 438/479; 438/492; 438/494; 977/762

(58) Field of Classification Search .............. 257/E21.09; 438/478, 479, 492, 494; 977/762
See application file for complete search history.

(56) References Cited

U.S. PATENT DOCUMENTS

| 6,326,311 B1 | 12/2001 | Ueda et al. |
| 6,858,478 B2 * | 2/2005 | Chau et al. .................. 438/149 |
| 7,078,299 B2 | 7/2006 | Maszara et al. |
| 2006/0197163 A1 | 9/2006 | Kato |
| 2007/0026617 A1 | 2/2007 | Adkisson et al. |

FOREIGN PATENT DOCUMENTS

DE   10 2005 038 943 A1   3/2006

OTHER PUBLICATIONS

International Search Report, PCT/EP2008/062622, Dec. 23, 2008, 3 pages.

* cited by examiner

*Primary Examiner* — Asok K Sarkar
(74) *Attorney, Agent, or Firm* — Gardere Wynne & Sewell LLP; Andre M. Szuwalski (57) ABSTRACT

A process for forming a wire portion in an integrated electronic circuit includes epitaxially growing the wire portion on a side surface of a seed layer portion ($1_1$, $1_2$). Cross-sectional dimensions of the wire portion correspond to a thickness of the seed layer portion and to a duration of the growing step. The seed layer portion is then selectively removed while the wire portion is retained fixedly on the circuit. Afterwards, heating of the circuit can cause the wire portion becoming rounded in cross-section. The wire portion obtained may be about 10 nanometers in diameter. It may be used for forming a channel of a MOS transistor devoid of short channel effect.

23 Claims, 6 Drawing Sheets

PROCESS FOR FORMING A WIRE PORTION IN AN INTEGRATED ELECTRONIC CIRCUIT

PRIORITY CLAIM

This application is a 371 filing from PCT/EP2008/062622 filed Sep. 22, 2008, which claims priority to European Patent Application 07301401.1 filed Sep. 26, 2007, the disclosures of which are hereby incorporated by reference.

TECHNICAL FIELD

The invention relates to a process for forming a wire portion in an integrated electronic circuit. It relates more specifically to a process for forming such wire portion with cross-sectional diameter of about 10 to 30 nanometers. A wire with such diameter is called a nanowire hereafter.

BACKGROUND

Nanowires are intended to be used for several applications within integrated circuits. One of the most important among these applications is the manufacturing of MOS transistors with channels composed of nanowires. Such transistors do not exhibit the so-called short channel effect and consequently provide for better control of the electrical conduction of the channel. Other applications for nanowires include the manufacturing of electrically conducting connections, resistors with resistance values controlled via the diameter of the resistive portion, stretch-sensors, etc.

At least three processes have already been implemented for manufacturing nanowires.

According to a first one of these processes, a stack comprising a layer of silicon superposed on a layer of silica is formed on a substrate of an integrated electronic circuit. Then the layer of silicon is etched from the top surface of the circuit in side parts of the stack so as to form a silicon track. Then, the silica material is selectively etched under a center portion of the track, so that a gap appears between this center portion of the silicon track and the substrate beneath. Afterwards the circuit is heated so as to make the cross-section of the center portion of the silicon track round. The silicon material is oxidized at the surface of the track and the silica material thus formed is selectively etched. Oxidizing and etching steps are alternately repeated so as to reduce progressively the diameter of the track in the center portion.

A second process involves a stack structure including hard masks. One of the hard masks has an opening with two opposite edges that are apart from each other with a separation gap smaller than opposite edges of an underlying silicon layer portion. The silicon layer portion is etched through the mask opening, thereby producing two parallel silicon wires along the edges of the mask.

Finally, a third process consists in growing ex-situ nanowires on a seed surface of silicon or germanium which supports nanoparticles of a catalyst, for example nanoparticles of gold. When such system is heated so that each catalyst particle forms a droplet on the seed surface, and further is fed with a gaseous precursor of silicon or germanium, then a nanowire grows from each catalyst nanoparticle with the longitudinal direction of said nanowire oriented perpendicular to the seed surface. Once a nanowire has reached a desired length, it is brought to the desired location on a circuit substrate. Handling of the nanowire from the growth location to the final location on the substrate can be performed using a tip similar to that of an atomic force microscope. But it is difficult to form a nanowire quite long using such process, and the shape of the nanowire portion is not well-controlled.

All processes cited above comprise many processing steps. Therefore, processing time of an integrated circuit which incorporates a nanowire so-obtained is long, leading to a high production cost.

Thus, there is a need to produce an integrated electrical circuit with at least one nanowire in a practical manner, with reduced increase in the production cost of the circuit.

SUMMARY

To this end, the invention provides a process for forming a wire portion in an integrated electronic circuit, which process comprises the following steps:

/1/ providing a substrate from which the circuit is to be produced, which substrate comprises a layer stack including a layer portion of a seed material and two layer portions of passive materials which are located on respective opposite faces of the layer portion of seed material, so that a crystalline part of the layer portion of seed material is exposed at a side surface of the stack between boundaries with the passive materials;

/2/ growing epitaxially a wire material on the seed material exposed at the side surface of the stack, said growing being selective with respect to the passive materials so as to form the wire portion extending on and along the exposed crystalline part of the layer portion of seed material, the wire material and the seed material having respective different chemical compositions; and /3/ removing the layer portion of seed material selectively with respect to the wire material while retaining fixedly the wire portion on the circuit substrate.

Hence, according to the invention, the wire portion is grown in situ on the substrate by selective lateral epitaxial growth from the exposed crystalline seed material. Therefore, no difficult and time-consuming transportation step is required for transporting the wire portion to its final location on the circuit substrate.

In addition, a process of the invention has the following advantages over the known prior art processes:

when being formed in step /2/, the wire portion is supported over its longitudinal direction by the layer portion of seed material. Thus, the shape of the wire portion is well-controlled via the layout out of the lateral edge of the stack. This layout includes the shape of a projection of this lateral edge in a plane parallel to the substrate surface and a thickness of the seed material portion exposed between the boundaries with the passive materials. It is easy in particular to form very long nanowires and also nanowires comprising several rectilinear segments with varying orientation parallel to the circuit substrate. In addition, a nanowire designed with angles between successive rectilinear segments is continuous at the angles. In the jargon of the man skilled in circuit layout, the invention is said to be compatible with bi-dimensional layout of nanowires;

the cross-sectional dimensions of the wire portion are determined by the thickness of the layer portion of seed material interposed between the layer portions of passive materials, and by the duration of the growing step /2/. So they are independent of the pitch of the lithography technology that is used for the circuit. Thus, it is not compulsory to reduce the cross-sectional area of the nanowire by further implementing alternatively oxidizing steps and etching steps;

because epitaxial growth can be very well controlled, the cross-sectional dimensions of the wire portion can be fixed with accuracy down to one atomic layer of wire material;

the process does not require using an electronic beam for implementing lithography in order to obtain very small cross-sectional dimensions for nanowires; and implementation of the process does not depend on the lithographic pitch. Put another way, an initial lithographic step which is used to etch the layer stack so as to produce the side surfaces of the seed material portion bounded with the passive material portions is not critical with respect to the cross-sectional dimensions of the nanowires obtained.

One would notice that it is not compulsory for implementing the present invention that the layer portion of the seed material be crystalline in its entirety. Indeed, it is sufficient that the seed material be crystalline in the part of the layer portion of seed material which is exposed. Furthermore, this crystalline part may not correspond to all seed material which is exposed at the side surface of the stack, but it may be only part of this latter. In particular, the layer portion of seed material may be provided in step /1/ so as it is amorphous in an initial stage, and then part of the seed material exposed at the side surface of the stack may be selectively crystallized in a further stage before step /2/.

The following features or improvements of the invention may be further implemented, independently or combined with one another:

the layer portion of the seed material may have a thickness of about 10 to 30 nanometers, in particular less than 20 nanometers, measured parallel to the stacking direction;

the crystalline part of the layer portion of seed material which is exposed at the side surface of the stack may have a varying thickness between the boundaries with the passive materials, measured parallel to the stacking direction of the layer stack at different locations in the exposed crystalline part of the layer portion of seed material;

the crystalline part of the layer portion of seed material which is exposed at the side surface of the stack may have a design which comprises at least one strip segment;

the wire material may be electrically conducting;

the seed material and the wire material may be selected from silicon, germanium, silicon-germanium alloys, and doped materials obtained therefrom;

the process may comprise a further step executed after step /3/, which consists in heating the wire portion so as to modify its cross-sectional shape;

at least two wire portions may be formed in step /2/ on respective crystalline parts of the layer portion of seed material which are exposed at opposite side surfaces of the layer stack;

the process may also comprise, between steps /1/ and /2/, a step of amorphizing a segment of the crystalline part of the layer portion of seed material which is exposed at the side surface of the layer stack so as to form two segments of crystalline seed material separated from each other by a segment of amorphous seed material. Then, step /2/ is carried out so that the wire material is grown on both segments of crystalline seed material selectively with respect to the segment of amorphous seed material. Thus two wire portions apart from each other can be obtained at the same time within one and same level above a base surface of the circuit substrate;

the layer stack may include several layer portions of seed material stacked alternately with layer portions of passive materials, so that respective crystalline parts of seed material are exposed one apart another at the side surface of the stack between boundaries with the passive materials. Step /2/ may be carried out then so that wire material is grown at a same time on each exposed part of seed material at the side surface of the stack. Thus, a plurality of wire portions shifted parallel to the stacking direction is formed at the same time, which correspond to the plurality of seed layer portions. Afterwards, step /3/ is carried out so as to remove each seed layer portion. It is thus possible to obtain a three-dimensional wire layout. Optionally, step /3/ may be carried out so as to remove all seed layer portions at a same time within a single removing step.

A process of the invention may be used for producing a MOS transistor with transistor channel of nanowire-type. To this end, an electrically insulating layer is formed at a peripheral surface of a wire portion formed according to the invention. Then, a gate portion of the transistor is formed about the peripheral surface of the wire portion. Such transistor does not exhibit short channel effect. It can also support high currents and has a short switching time.

Another application of the invention is the manufacturing of single-electron transistors. Such transistors include two facing electrically conducting nanotips. These nanotips are adapted so that a passage of one single electron from one tip to the other can be controlled.

BRIEF DESCRIPTION OF THE DRAWINGS

Other explanations and advantages of the invention will be apparent from the detailed and non-limiting implementation examples described hereafter, in connection with the appended drawings comprising.

DETAILED DESCRIPTION OF THE DRAWINGS

For the sake of clarity, dimensions of circuit parts that are represented on these figures are not in relation with actual dimensions or actual dimension ratios. In addition, identical reference numbers indicated on different figures refer to identical elements or elements with identical functions. The circuit is located in the bottom parts of the figures, with active surface facing upwards. N indicates a vertical direction oriented from bottom to top of the figures. Words "on", "above", "below", "lower" and "upper" are used hereafter in reference with direction N.

Several implementations of the invention are described now, in which circuit processing steps are cited in a correct order so as to reproduce the invention. Details of the individual processing steps which are well known to a circuit manufacturer are not reported. One would refer to the numerous appropriate documents that are available, including instructions that are provided with the circuit processing tools by the suppliers of these tools.

Figure 1:
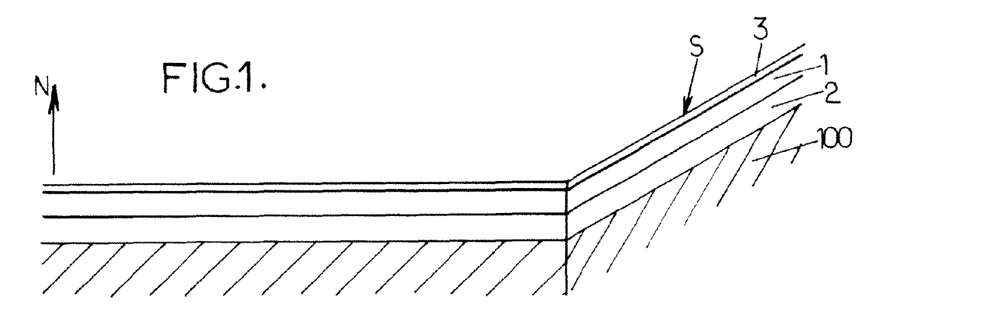
FIGS. 1-5 are perspective views of an integrated electronic circuit being manufactured, corresponding to successive steps of a process according to a first implementation of the invention.

Referring to FIG. 1, a substrate for an integrated electronic circuit comprises a base portion 100, a first passive layer 2 and an upper layer of crystalline seed material 1. Such substrate may be a commercially available SOI ("Silicon On Isolator") substrate. In this case, passive layer 2 is called buried oxide, and is composed of silica ($SiO_2$). Layer 1 is of single crystalline silicon (Si).

The upper surface S of layer 1 may be put into contact with an oxidizing agent, so as to form an upper oxide layer 3. The layer 3 is then of silica and may be 2 nanometers thick. Remaining silicon thickness of layer 1 may be about 10-15 nm. Layer 3 forms a second passive layer of a stack comprising layers 1-3. N corresponds to the stacking direction.

Figure 2:
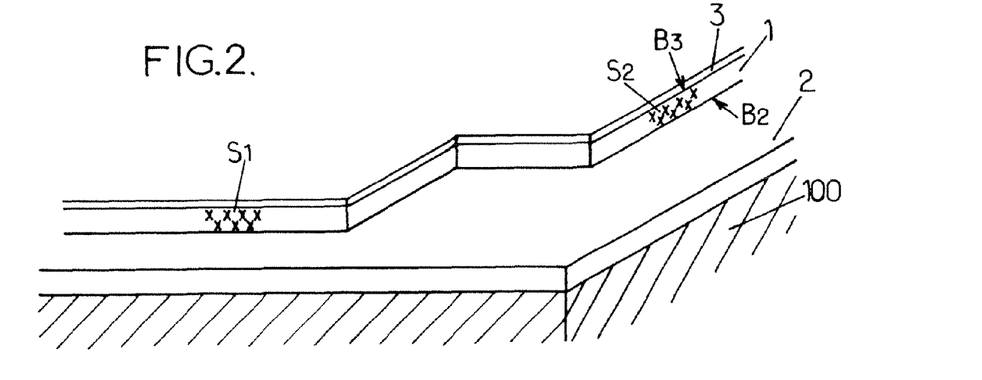

Layers 3 and 1 are etched according to a pattern with edges that correspond to the layout of nanowires to be formed. Masking, lithographic and etching steps are executed in a known manner, so as to expose a side surface of layer 1 limited by boundaries B2 and B3 of layer 1 respectively with layers 2 and 3 (FIG. 2). The exposed side surface of layer 1 is then a strip oriented perpendicular to the upper surface of the base portion 100, and runs parallel to this latter surface.

Although the invention is currently described starting from a SOI substrate, this is not compulsory provided that the circuit is provided with a configuration equivalent to that represented on FIG. 2.

Optionally, selected segments of the strip of exposed crystalline material of layer 1 may be submitted to an ionic beam, so as to make it turn from crystalline structure to amorphous structure. The ionic beam to be used may be similar to that used for implanting doping ions, but it is now operated with heavy ions such as silicon, germanium or xenon ions. The ions selected are suitable for amorphizing locally the layer 1 where it is impacted, via kinetic energy transfer occurring during collisions between these ions and the lattice of layer 1. The ion beam is focused and directed from upwards onto the strip segments to convert to amorphous structure, with angular tilt of about 30° to 50° so as to impact on the side surface of layer 1. Reference signs S1 and S2 denote such amorphous segments of the side surface of layer 1. Alternatively, implanting elements such as oxygen or germanium, for example, may also be used for amorphizing parts of the crystalline seed material of layer 1 which are exposed.

Figure 3:
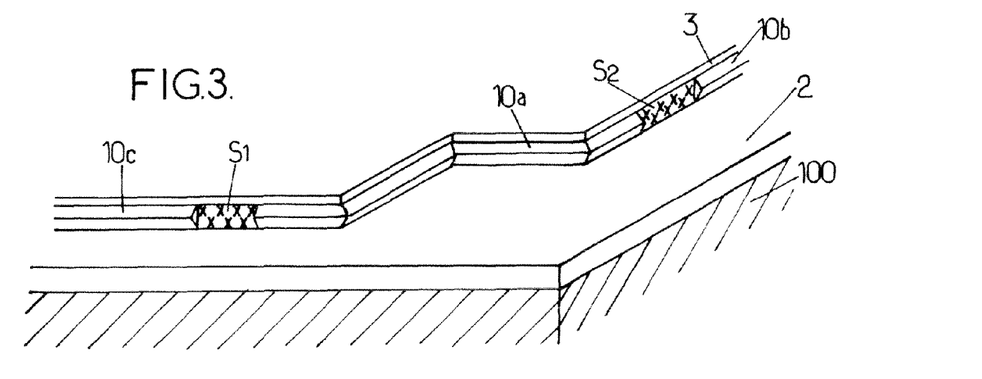

An alloy of silicon and germanium ($Si_xGe_y$) is then grown epitaxially on the exposed crystalline material of layer 1. Lateral epitaxial growth is thus achieved, and the crystalline material of layer 1, which is single crystalline silicon in the present implementation, is called the seed material. For example, the circuit is heated to about 550° C. to 750° C. and is contacted with a gaseous stream containing dichlorosilane molecules ($SiH_2Cl_2$) and germanium hydride molecules ($GeH_4$), at pressure of about 10 to 100 Torr. The epitaxial material which is grown forms portions 10a-10c of nanowires. In the present case, a crystalline alloy of silicon and germanium is formed on the exposed single crystalline silicon of layer 1, selectively with respect to the passive materials of layers 2 and 3 and with respect to the amorphous material of strip segments S1 and S2 (FIG. 3). Portions 10a-10c are separated from each other along the edge of the stack by gaps located in front of the amorphous segments S1 and S2.

Usually, the crystallographic axis [1 0 0] of silicon in portion 1 is oriented parallel to direction N. The inventors have observed that the epitaxial growth of the nanowire material on the side surface of the portion 1 produces faceting. The nanowire portions 10a-10c as grown have a triangular cross section, with growth faces oriented obliquely. In particular, the growth faces of the portions 10a-10c may form an angle of 54.11° with direction N when a usual SOI substrate is used. The epitaxial growth of the portions 10a-10c may be stopped when the cross-sectional dimensions of these portions are about 10 nm. Actually, the epitaxial growth is limited by the boundaries B2 and B3, as the growth faces of the portions 10a-10c reach these boundaries.

Figure 4:
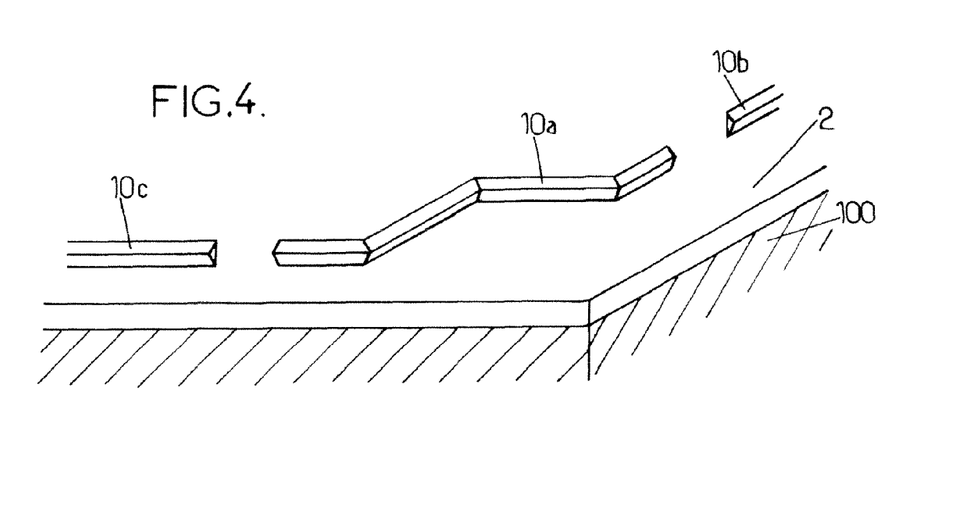

Remaining parts of layers 3 and 1 are then removed. For example, the circuit is first contacted with a liquid solution containing silica etching species. An etching duration is selected so that layer 3 is completely removed due to its very small thickness whereas layer 2 is substantially unchanged. Then, silicon material of layer 1 is removed selectively with respect to the silicon-germanium alloy of the portions 10a-10c. Configuration of the circuit which is represented on FIG. 4 is obtained, where the nanowire portions 10a-10c lie on the upper surface of layer 2.

Then, according to a first possible improvement of the invention, parts of the nanowire portions 10a-10c may be selectively removed, depending on the desired final layout of the nanowires. A mask may be formed on the circuit, which protects parts of the portions 10a-10c that are to remain, and the unprotected parts of the portions 10a-10c are removed using an appropriate etching process.

Figure 5:
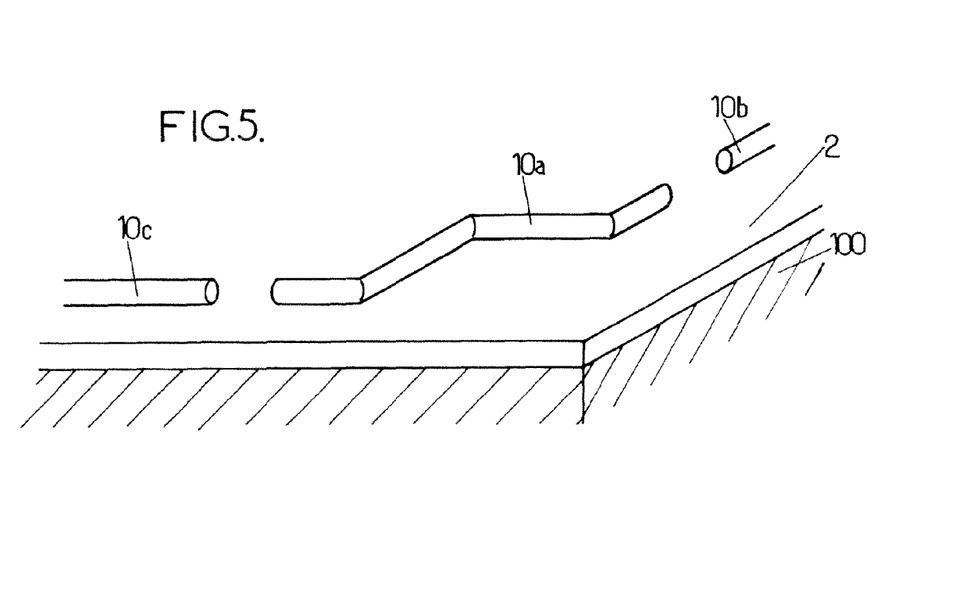

Afterwards, the forming of the nanowires may be completed by heating the circuit between about 700° C. to 900° C. At such temperature, capillary forces at the surface of the portions 10a-10c cause their cross-section to change in shape, becoming more round (FIG. 5). Each portion 10a-10c forms a nanowire which can be used as a current conducting element within the integrated circuit, for example.

According to a second possible improvement of the invention, the cross-sectional diameter of each portion 10a-10c may be reduced, for example down to values below 10 nm or even 7 nm. For this purpose, the circuit may be contacted with an oxidizing agent preferably in gaseous phase. The oxidation time is selected so as to change a very thin layer at the surface of the portions 10a-10c into oxide. Then, the oxide layer may be selectively removed, thereby leading to a reduction in the diameter of each nanowire portion composed of metallic silicon-germanium alloy. If necessary, the operations of oxidizing and etching of the oxide formed may be repeated to further reduce the diameter of the portions 10a-10c.

FIGS. 6-10 refer to another implementation of the invention for producing a multichannel MOS field effect transistor. FIGS. 6-10 represent a half of the circuit being produced, with section plane being the front plane of the figures.

Figure 6:
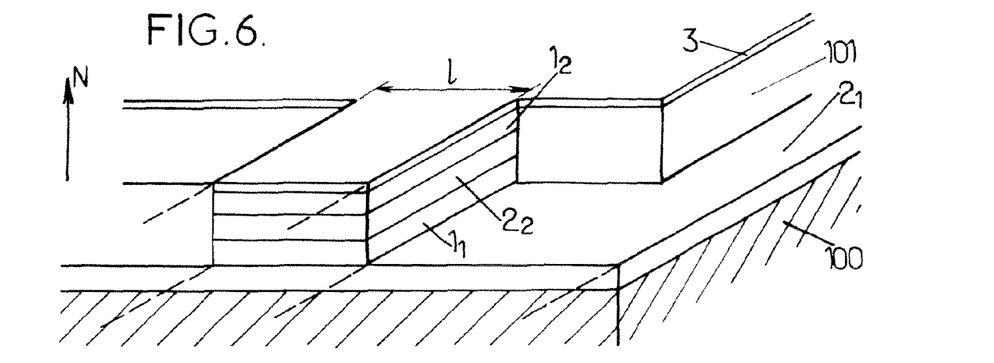
FIGS. 6-10 are perspective views of another integrated electronic circuit being manufactured, corresponding to successive steps of a process according to a second implementation of the invention.

According to FIG. 6, the circuit substrate comprises a base portion 100 with an overlying first passive layer $2_1$. A stack of layer portions arranged on the layer $2_1$ comprises: a first seed portion layer $1_1$, a second passive layer portion $2_2$, a second seed portion layer $1_2$, and a third passive layer portion 3. Layer portions $1_1$ and $1_2$ may be of single crystalline silicon, and layer portions $2_1$, $2_2$ and 3 may be of silica. A support portion 101 is also arranged on the layer $2_1$, so as to be in solid contact with each layer portion of the stack.

The width of the stack, parallel to the surface of the base portion 100, is denoted I. It may be defined via a lithographic resin mask. Then, each one of the layer portions $1_1$ and $1_2$ has opposite side surfaces which are separated from each other by the width I, which is at least equal to the pitch of the lithography technology that has been used. The width I may be further reduced, down to values as low as 25 nm or even 10 nm for example, by implementing a lateral shrinking of the resin mask after it has been formed by lithography on the circuit substrate provided with the initial layers $2_1$, $1_1$, $2_2$, $1_2$ and 3. Such a mask shrinking process is well-known in the art for producing circuit parts smaller than the lithography pitch. It consists in progressively etching the resin mask parallel to the substrate surface by exposing the mask to a plasma.

Figure 7:
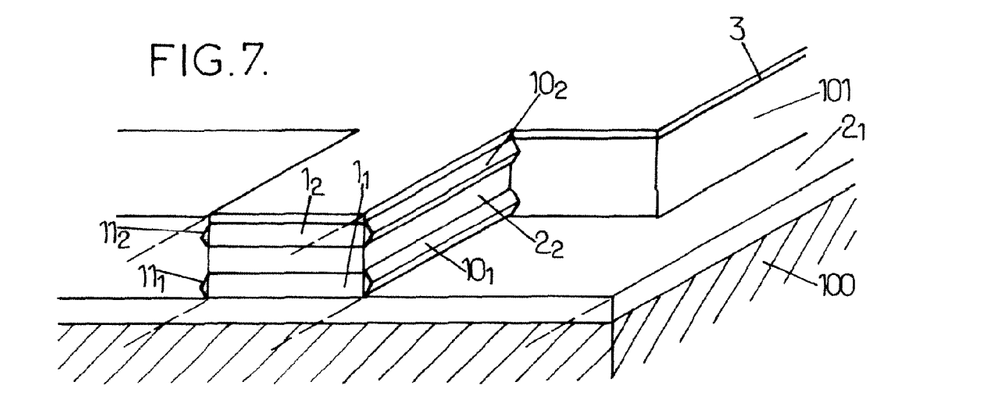

Silicon-germanium alloy is grown on the exposed side surfaces of the seed material layer portions $1_1$ and $1_2$. Thus nanowire portions are formed on each side of the layer portions $1_1$ and $1_2$, thereby leading to four nanowire portions denoted $10_1$, $11_1$, $10_2$ and $11_2$ (FIG. 7).

Figure 8:
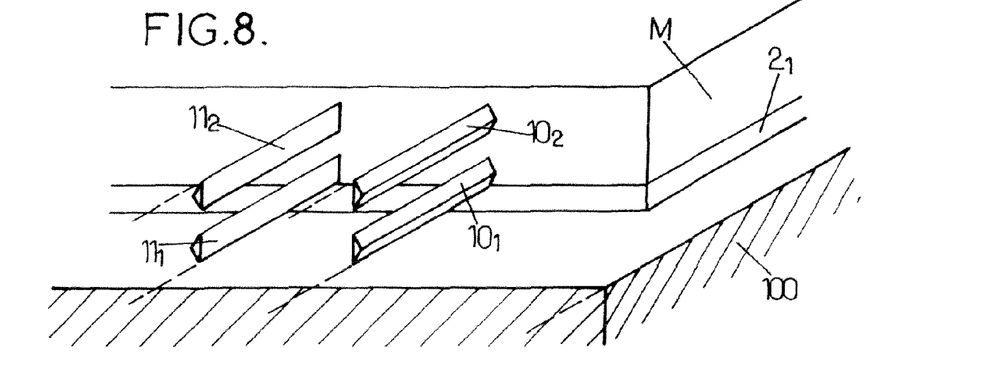

The support portion 101 may be then encapsulated within a protective mask M, with the stack together with the nanowire portions extending outside this mask. The mask M may be composed of lithographic resin, for example. The layer portions 3, $1_2$, $2_2$ and $1_1$, together with the exposed part of the layer $2_1$ are selectively removed based on chemical selection of silica and silicon with respect to silicon-germanium alloy and mask material. The circuit configuration represented on FIG. 8 is obtained, with the nanowire portions extending outwardly from the support portion 101 covered with the mask M, and supported at their end parts by this support portion.

Figure 9:
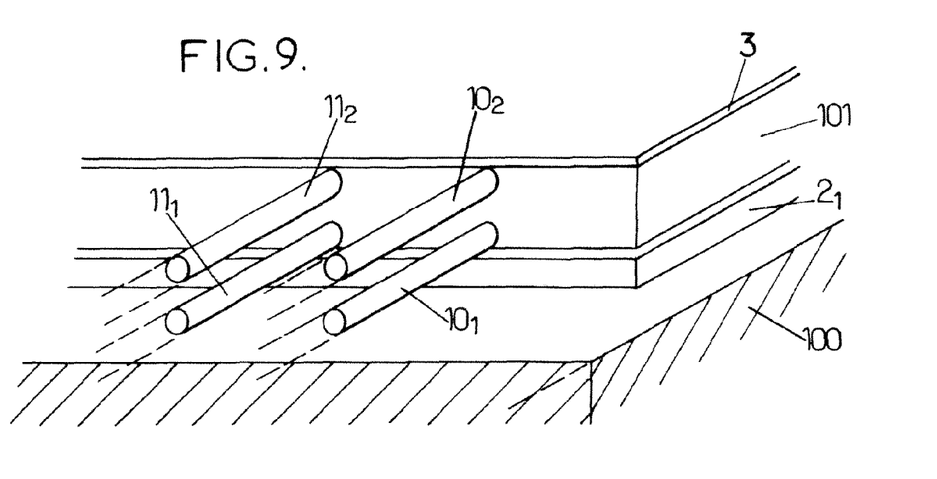

Mask M is dissolved and the circuit is heated above 700° C. for making the nanowire portions becoming rounded in cross-section (FIG. 9).

Figure 10:
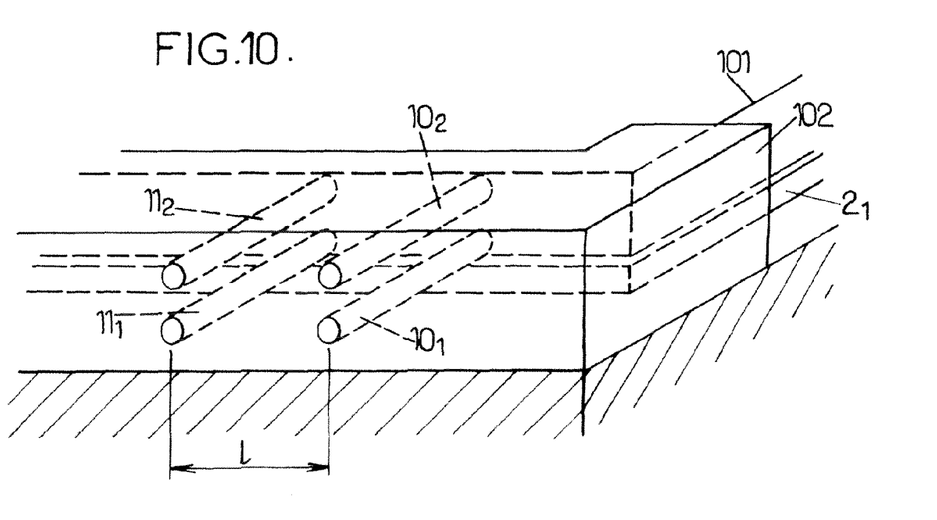

Then the circuit is contacted with an oxidizing agent so as to form a thin electrically insulating oxide layer (not represented) at the surface of the nanowire portions $10_1$, $11_1$, $10_2$ and $11_2$ and on the exposed surfaces of the support portion 101 and the base portion 100. Finally, a surrounding portion 102 is formed, for example of polycrystalline silicon (Si-poly), about the nanowires portions $10_1$, $11_1$, $10_2$ and $11_2$, between the support portion 101 and another support portion arranged symmetrically with this latter ahead of the front plane of the perspective views. In the final integrated circuit, both supporting portions form a source portion and a drain portion of the transistor, the surrounding portion 102 forms the gate portion of the transistor, and the nanowires $10_1$, $11_1$, $10_2$ and $11_2$ form respective parallel channel wires. For example, the nanowires $10_1$, $11_1$, $10_2$ and $11_2$ may be each 10 nm in diameter, 200 nm long and 25 down to 10 nanometers apart from each other.

Optionally, several identical stacks of layer portions may be arranged apart one from another on the surface of the layer $2_1$, with shifting direction parallel to the front plane of the figures. Then, the final transistor will have a channel composed of 4×n nanowires, where n denotes the number of stacks.

Also the specific design of the part of the layer portion of crystalline seed material which is exposed at the side surface of the layer stack may be varied. This design may include one or more strip segments, aligned along a common direction or with varying directions, but also any other pattern depending on the particular layout of the integrated circuit being produced. Such other pattern may be obtained from a seed layer portion with non-uniform thickness, for example.

An example is now given in connection FIGS. 11-15, for implementing the invention so as to produce at the same time a wire portion oriented parallel to the substrate surface and a wire portion oriented perpendicular to this surface. Such implementation leads to 3-dimensional wire design and may be useful within the connection levels of an integrated electrical circuit.

Figure 11:
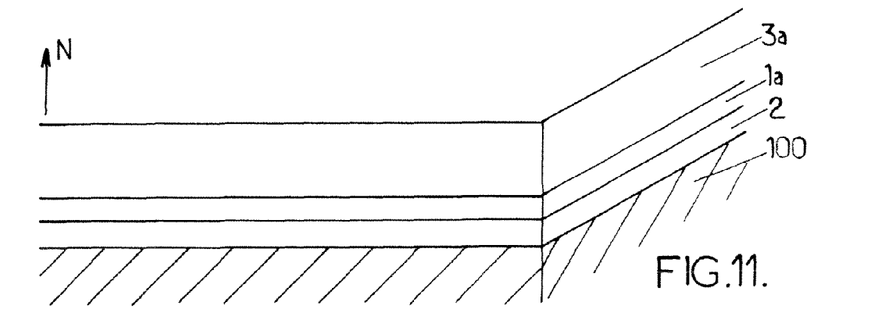
FIGS. 11-15 are perspective views of still another integrated electronic circuit being manufactured, corresponding to successive steps of a process according to a third implementation of the invention.
Figure 12:
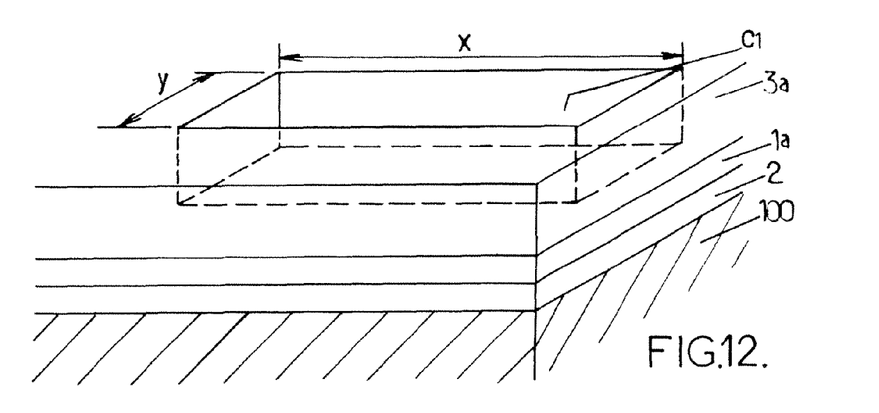

Starting with FIG. 11, a circuit base portion 100 is provided with a layer stack comprising, from bottom to top along the direction N: a first passive layer 2, a layer of crystalline seed material 1a and a second layer of passive material 3a. Layers 2 and 3a may be of silica, and layer 1a may be of crystalline silicon-germanium alloy. Substrates including the base portion 100 and the layers 2 and 1a are commercially available. Layer 3a is added in a manner known per se, for example for obtaining highly dense material for this layer.

Then a cavity C1 is formed within layer 3a (FIG. 12), which extends along the direction N from the top surface of layer 3a to the bottom surface of the same, in contact with layer 1a. Thus, a part of the top surface of layer 1a is exposed in cavity C1. Cavity C1 may be formed using a lithographic mask (not shown) arranged on layer 3a, and then implementing a directional etching process through an aperture of the mask. For example, the cavity C1 may be rectangular within a plane perpendicular to direction N, with a length X longer than a width y of this cavity. The lithographic mask is then removed.

Figure 13:
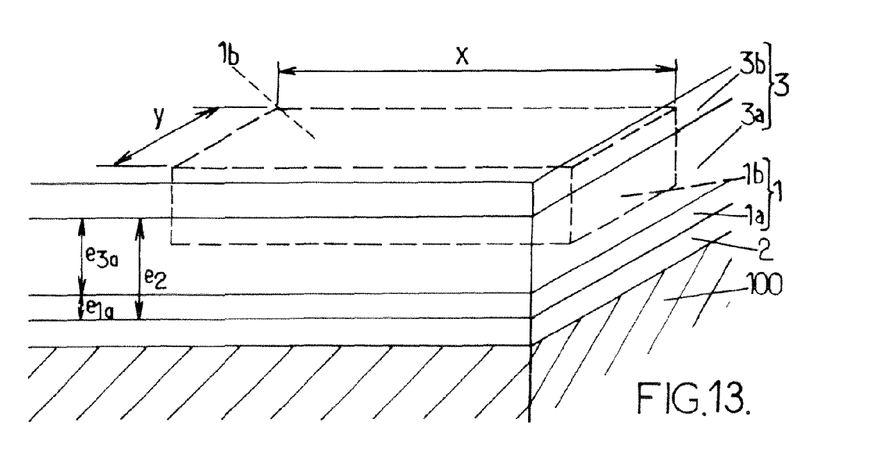

Afterwards, silicon-germanium alloy is growth epitaxially within the cavity C1, from the exposed part of the top surface of layer 1a, so as to fill the cavity C1 (FIG. 13). The portion of silicon-germanium alloy which is added in this manner is referenced 1b. It is in contact with layer 1a, so that one can consider that the layer 1a together with the portion 1b forms a single layer portion with varying thickness. The resulting thickness-varying layer portion is composed of seed material, and thus is referenced 1 again. This portion 1 has a total thickness $e_2$ at the location of the cavity C1, which is the sum of the thickness $e_{1a}$ of layer 1a and the thickness $e_{3a}$ of layer 3a. y and X are also the in-plane dimensions of portion 1b. At this time, the upper surface of the circuit may be planarized by polishing.

Another layer of passive material 3b is formed on the circuit. Layer 3b is continuous over the portion 1b and may be composed of silica or silicon nitride ($Si_3N_4$). It is in contact with layer 3a, so that one can consider that layer 3a together with layer 3b form a single layer portion with varying thickness. The resulting thickness-varying passive layer portion is referenced 3.

Another cavity C2 is formed from the top surface of layer 3b (FIG. 14), using another lithographic mask (not shown) and an appropriate directional etching process. The cavity C2 is also rectangular within a plane perpendicular to the direction N, and is located so that it crosses the portion 1b of silicon-germanium alloy. Thus, the cavity C2 has a length Y which is longer than the width y of the portion 1b, and a width x which is less than the length X of the portion 1b. The cavity C2 extends down to the interface between the layers 1a and 2. Parts of layer 1a and portion 1b, i.e. parts of the seed layer portion 1 are thus exposed within the cavity C2. They are parallel to direction N with thickness $e_{1a}$ or $e_2$, depending on the wall of the cavity C2 that comprises each exposed part of the seed layer portion 1. In FIG. 14, B2 and B3 denote again the boundaries of the exposed parts of the seed layer portion 1 with the layer portion 2 and the layer portion 3, respectively. Boundary B3 is stepwise at the corners of the cavity C2, in accordance with the varying thickness of the seed layer portion 1. The exposed parts of the seed layer portion 1 are hatched on the figure.

Figure 14:
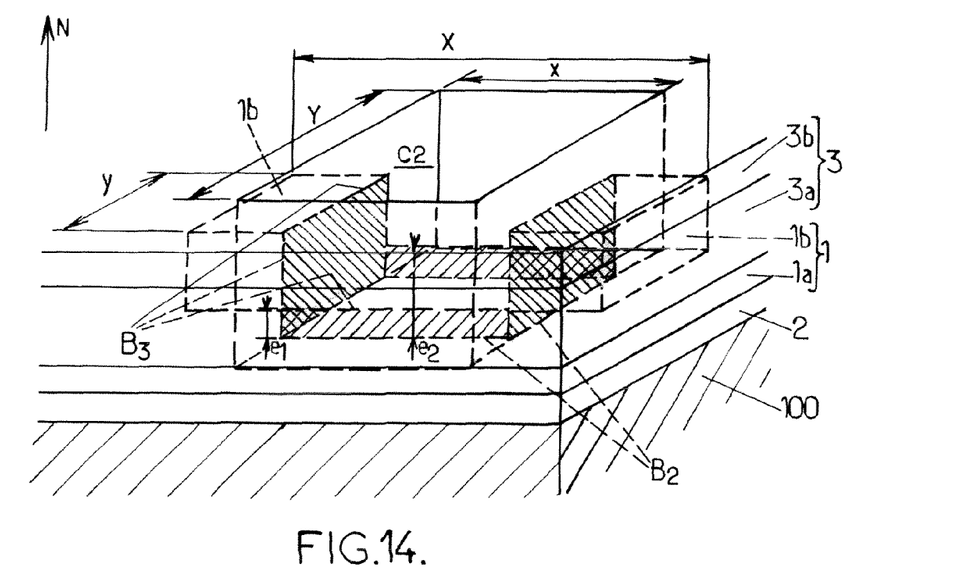

Silicon is then grown epitaxially within the cavity C2 from the exposed parts of the seed layer portion 1, selectively with respect to the exposed passive materials. Such growth occurs when silicon precursors enter into the cavity C2, for example in gaseous phase, and then react on the exposed parts of the seed layer portion 1. A wire portion 10 composed of silicon with complex shape is thus formed, corresponding to the exposed parts of layer 1a and portion 1b.

Figure 15:
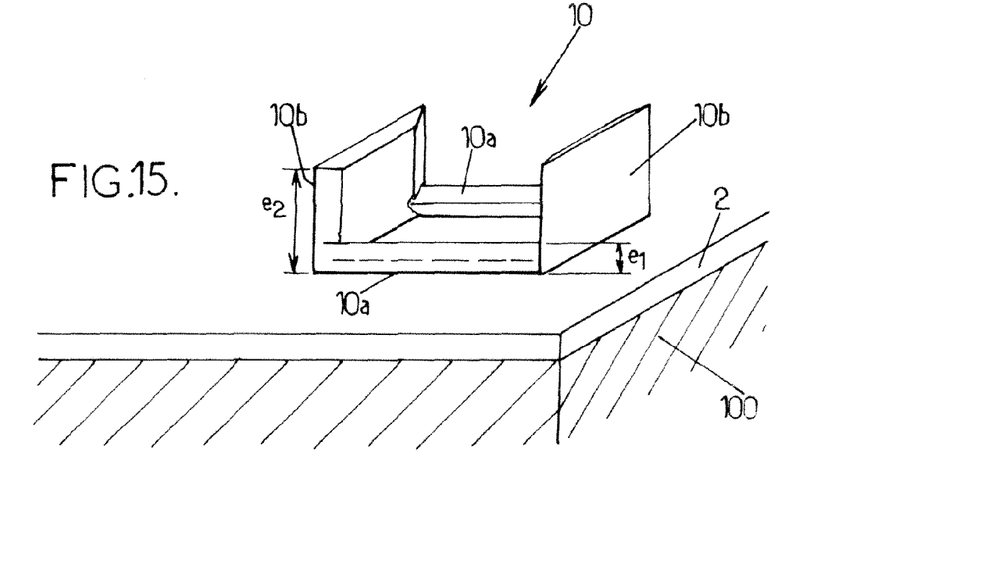

Passive materials of layers 3a and 3b are then removed selectively with respect to silicon material, using an appropriate selective etching process. Then, exposed silicon-germanium alloy of portion 1b and layer 1a is also removed, selectively with respect to the silicon material of the wire portion 10. Thus, the wire portion 10 remains isolated on the layer 2 (FIG. 15). It comprises two first parts 10a which extend respectively on the exposed parts of the seed layer portion 1 where this latter has the thickness value $e_{1a}$. It further comprises two second parts 10b which extend respectively on the exposed parts of the seed layer portion 1 where it has the thickness value $e_2$. In the resulting circuit, the parts 10a of the wire portion 10 may form two electrically conducting tracks within a connection level of the circuit, and the parts 10b may form two electrically conducting vias oriented perpendicular to said connection level of the circuit.

It is mentioned that many changes in the implementations of the invention that have been described above can be introduced, while maintaining at least some of the advantages provided by using lateral epitaxial growth for the wire portions. In particular, the materials that have been cited may be varied in a great extend, provided that the wire material has a crystalline network compatible with that of the seed material, while being different. For example, any couple of materials selected among pure or electrically doped silicon, pure or electrically doped germanium, pure or electrically doped silicon-germanium alloy, silicon with varying boron contents, and germanium with varying boron content may be used for the nanowire material and the seed material. Also couples of semiconducting materials from series III-V, based for example on the combination of arsenic with gallium, may be used as seed material and wire material.

In addition, the wire portions formed by implementing the invention may not be limited to the shapes and the numbers of constituting parts that have been described.

The invention claimed is:

1. Process for forming a wire portion in an integrated electronic circuit, comprising the following steps:
   /1/ providing a substrate from which the circuit is to be produced, which substrate comprises a layer stack including a layer portion of seed material and two layer portions of passive materials located on respective opposite faces of said layer portion of seed material, so that a crystalline part of the layer portion of seed material is exposed at a side surface of the stack between boundaries with said passive materials;
   /2/ growing epitaxially a wire material on the seed material exposed at the side surface of the stack, said growing being selective with respect to the passive materials so as to form the wire portion extending on and along the exposed crystalline part of the layer portion of seed material, the wire material and the seed material having respective different chemical compositions; and
   /3/ removing the layer portion of seed material selectively with respect to the wire material while retaining fixedly the wire portion on the circuit substrate,
   wherein the crystalline part of the layer portion of seed material exposed at the side surface of the stack has a varying thickness between the boundaries with said passive materials, measured parallel to a stacking direction of the layer stack at different locations in said exposed crystalline part of the layer portion of seed material.

2. Process according to claim 1, wherein at least one first part of the wire portion extends on the exposed crystalline part of the layer portion of seed material where said exposed crystalline part has a first thickness value, and said first part of the wire portion forms an electrically conducting track within a connection level of the circuit, and
   wherein at least one second part of the wire portion extends on the exposed crystalline part of the layer portion of seed material where said exposed crystalline part has a second thickness value greater than said first thickness value, and said second part of the wire portion forms an electrically conducting via oriented perpendicular to said connection level of the circuit.

3. Process according to claim 2, wherein each layer portion of seed material has a thickness of about 10 to 30 nanometers, in particular less than 20 nanometers, measured parallel to a stacking direction of the layer stack.

4. Process according to claim 2, wherein the crystalline part of each layer portion of seed material exposed at the side surface of the stack has a design comprising at least one strip segment.

5. Process according to claim 1, wherein the wire material is electrically conducting.

6. Process according to claim 1, wherein the seed material and the wire material are selected from the group consisting of silicon, germanium, silicon-germanium alloys, and doped materials obtained therefrom.

7. Process according to claim 1, further comprising the following step:
   /4/ heating each wire portion so as to modify a cross-sectional shape of said wire portion.

8. Process according to claim 1, further comprising the following steps:
   oxidizing the wire material at a peripheral surface of each wire portion; and
   selectively removing oxidized wire material with respect to non-oxidized wire material.

9. Process according to claim 1, wherein at least two wire portions are formed in step /2/ on respective crystalline parts of each layer portion of seed material exposed at opposite side surfaces of the layer stack.

10. Process according to claim 9, wherein the opposite side surfaces of the layer stack are defined by shrinking a resin mask formed on the circuit substrate.

11. Process according to claim 1, further comprising the following step executed between steps /1/ and /2/:
    amorphizing a segment of the crystalline part of the layer portion of seed material exposed at the side surface of the layer stack so as to form two segments of exposed crystalline seed material separated from each other by a segment of amorphous seed material,
    and wherein step /2/ is carried out so that the wire material is grown on both segments of crystalline seed material selectively with respect to the segment of amorphous seed material.

12. Process according to claim 1, further comprising:
    forming an electrically insulating layer at a peripheral surface of the wire portion; and
    forming a gate portion surrounding said peripheral surface of the wire portion,
    so that the wire portion forms a channel of a MOS transistor comprising said wire portion and said gate portion.

13. Process for forming several wire portions in an integrated electronic circuit, comprising the following steps:
    /1/ providing a substrate from which the circuit is to be produced, which substrate comprises a layer stack including several layer portions of seed material stacked alternately with layer portions of passive materials, two of the layer portions of passive materials being located on respective opposite faces of each layer portion of seed material, so that several crystalline parts of seed material are exposed one apart another at the side surface of the stack, respectively corresponding to said layer portions of seed material, between boundaries with said passive materials;

/2/ growing epitaxially a wire material on the seed material exposed at the side surface of the stack, said growing being selective with respect to the passive materials so as to form the wire portions extending on and along the exposed crystalline parts of the layer portions of seed material, the wire material and the seed material having respective different chemical compositions; and /3/ removing the layer portions of seed material selectively with respect to the wire material while retaining fixedly the wire portions on the circuit substrate;

wherein step /2/ is carried out so that wire material is grown simultaneously on each one of said crystalline parts of seed material exposed at the side surface of the stack, thereby forming the plurality of corresponding wire portions shifted parallel to a stacking direction of the layer stack, and wherein step /3/ is carried out so as to remove each layer portion of seed material.

14. Process according to claim 13, wherein each layer portion of seed material has a thickness of about 10 to 30 nanometers, in particular less than 20 nanometers, measured parallel to a stacking direction of the layer stack.

15. Process according to claim 13, wherein the crystalline part of each layer portion of seed material exposed at the side surface of the stack has a design comprising at least one strip segment.

16. Process according to claim 13, wherein the wire material is electrically conducting.

17. Process according to claim 13, wherein the seed material and the wire material are selected from the group consisting of silicon, germanium, silicon-germanium alloys, and doped materials obtained therefrom.

18. Process according to claim 13, further comprising the following step:

/4/ heating each wire portion so as to modify a cross-sectional shape of said wire portion.

19. Process according to claim 13, further comprising the following steps:

oxidizing the wire material at a peripheral surface of each wire portion; and selectively removing oxidized wire material with respect to non-oxidized wire material.

20. Process according to claim 13, wherein at least two wire portions are formed in step /2/ on respective crystalline parts of each layer portion of seed material exposed at opposite side surfaces of the layer stack.

21. Process according to claim 20, wherein the opposite side surfaces of the layer stack are defined by shrinking a resin mask formed on the circuit substrate.

22. Process according to claim 13, further comprising the following step executed between steps /1/ and /2/:

amorphizing a segment of the crystalline part of the layer portion of seed material exposed at the side surface of the layer stack so as to form two segments of exposed crystalline seed material separated from each other by a segment of amorphous seed material, and wherein step /2/ is carried out so that the wire material is grown on both segments of crystalline seed material selectively with respect to the segment of amorphous seed material.

23. Process according to claim 13, further comprising:

forming an electrically insulating layer at a peripheral surface of the wire portion; and forming a gate portion surrounding said peripheral surface of the wire portion, so that the wire portion forms a channel of a MOS transistor comprising said wire portion and said gate portion.

* * * * *